(12) United States Patent
Cheung et al.

(10) Patent No.: US 8,716,143 B1
(45) Date of Patent: *May 6, 2014

(54) PLASMA BASED PHOTORESIST REMOVAL SYSTEM FOR CLEANING POST ASH RESIDUE

(75) Inventors: David Cheung, Foster City, CA (US); Kirk J. Ostrowski, San Jose, CA (US)

(73) Assignee: Novellus Systems, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/370,689

(22) Filed: Feb. 10, 2012

Related U.S. Application Data

(63) Continuation of application No. 11/128,930, filed on May 12, 2005, now Pat. No. 8,129,281.

(51) Int. Cl.
  *H01L 21/302* (2006.01)
  *H01L 21/461* (2006.01)
  *B08B 6/00* (2006.01)
  *H01L 21/311* (2006.01)
  *H01L 21/4763* (2006.01)

(52) U.S. Cl.
  CPC .......... *H01L 21/311* (2013.01); *H01L 21/4763* (2013.01); *H01L 21/302* (2013.01)
  USPC ............... 438/732; 438/706; 438/627; 134/1; 134/1.1

(58) Field of Classification Search
  CPC ... H01L 23/58; H01L 21/311; H01L 21/4763; H01L 21/302
  USPC ........................ 438/706, 732, 627; 134/1, 1.1
  See application file for complete search history.

(56) References Cited

U.S. PATENT DOCUMENTS

| | | |
|---|---|---|
| 4,201,579 A | 5/1980 | Robinson et al. |
| 4,357,203 A | 11/1982 | Zelez |
| 4,699,689 A | 10/1987 | Bersin |
| 5,122,225 A | 6/1992 | Douglas |
| 5,158,644 A | 10/1992 | Cheung et al. |
| 5,292,393 A | 3/1994 | Maydan et al. |
| 5,354,386 A | 10/1994 | Cheung et al. |
| 5,593,541 A | 1/1997 | Wong et al. |
| 5,626,678 A | 5/1997 | Sahin et al. |
| 5,633,073 A | 5/1997 | Cheung et al. |
| 5,660,682 A | 8/1997 | Zhao et al. |
| 5,707,485 A | 1/1998 | Rolfson et al. |
| 5,767,021 A | 6/1998 | Imai et al. |
| 5,792,269 A | 8/1998 | Deacon et al. |
| 5,811,358 A | 9/1998 | Tseng et al. |
| 5,814,155 A | 9/1998 | Solis et al. |
| 5,817,406 A | 10/1998 | Cheung et al. |
| 5,820,685 A | 10/1998 | Kurihara et al. |
| 5,830,775 A | 11/1998 | Maa et al. |
| 5,844,195 A | 12/1998 | Fairbairn et al. |
| 5,900,351 A | 5/1999 | Lutsic et al. |
| 5,908,672 A | 6/1999 | Ryu et al. |
| 5,911,834 A | 6/1999 | Fairbairn et al. |
| 5,968,324 A | 10/1999 | Cheung et al. |
| 5,980,770 A | 11/1999 | Ramachandran et al. |
| 6,013,574 A | 1/2000 | Hause et al. |
| 6,030,901 A | 2/2000 | Hopper et al. |
| 6,039,834 A | 3/2000 | Tanaka et al. |
| 6,045,618 A | 4/2000 | Raoux et al. |
| 6,054,379 A | 4/2000 | Yau et al. |
| 6,072,227 A | 6/2000 | Yau et al. |
| 6,077,764 A | 6/2000 | Sugiarto et al. |
| 6,083,852 A | 7/2000 | Cheung et al. |
| 6,086,952 A | 7/2000 | Lang et al. |
| 6,098,568 A | 8/2000 | Raoux et al. |
| 6,107,184 A | 8/2000 | Mandal et al. |
| 6,125,788 A | 10/2000 | Hills et al. |
| 6,127,262 A | 10/2000 | Huang et al. |
| 6,129,091 A | 10/2000 | Lee et al. |
| 6,130,166 A | 10/2000 | Yeh |
| 6,156,149 A | 12/2000 | Cheung et al. |
| 6,162,323 A | 12/2000 | Koshimizu |
| 6,171,945 B1 | 1/2001 | Mandal et al. |
| 6,177,347 B1 * | 1/2001 | Liu et al. ........................ 438/675 |

(Continued)

FOREIGN PATENT DOCUMENTS

| | | |
|---|---|---|
| EP | 0 304 068 | 2/1989 |
| EP | 1 077 476 | 2/2001 |

(Continued)

OTHER PUBLICATIONS

Kikuchi et al., Native Oxide Removal on Si Surfaces by NF3-Added Hydrogen and Water Vapor Plasma Downstream Treatment, Jpn J. Appl. Phys. vol. 33 (1994), pp. 2207-2211, Part 1, No. 4B, Apr. 1994.

Woody K. Chung, "Downstream Plasma Removal of Mobile Ion Impurity From $SIO_2$,", Published Proceedings of the 8th International Plasma Processing Symposium, Fall 1990, 7 pages.

Woody K, Chung, "Low Damage, Downstream RF Plasma Ashing of High Energy, Heavily Doped Implanted Resists," Semicon Korea, Dec. 1989.

A. Kalnitsky and W. K. Chung, "Characterization and Optimization of a Single Wafer Downstream Plasma Stripper," Journal of the Electrochemical Society, vol. 135, No. 9, Sep. 1988, pp. 2338-2341.

Goto et al., "Enhanced Stripping of Low-K Films Using Downstream Gas Mixing," Novellus Systems, Inc., U.S. Appl. No. 10/890,653, filed Jul. 13, 2004.

(Continued)

*Primary Examiner* — Nadine Norton
*Assistant Examiner* — Mahmoud Dahimene
(74) *Attorney, Agent, or Firm* — Weaver Austin Villeneuve & Sampson LLP

(57) ABSTRACT

A method of cleaning a low dielectric constant film in a lithographic process includes providing a dielectric film having thereover a resist composition, the dielectric film having a dielectric constant no greater than about 4.0, and stripping the resist composition to leave a substantially silicon-containing ash residue on the dielectric film. The method then includes contacting the ash residue with plasma comprising an ionized, essentially pure noble gas such as helium to remove the resist residue without substantially affecting the underlying dielectric film.

20 Claims, 1 Drawing Sheet

(56) References Cited

U.S. PATENT DOCUMENTS

| | | |
|---|---|---|
| 6,184,134 B1 | 2/2001 | Chaudhary et al. |
| 6,187,072 B1 | 2/2001 | Cheung et al. |
| 6,193,802 B1 | 2/2001 | Pang et al. |
| 6,194,628 B1 | 2/2001 | Pang et al. |
| 6,203,657 B1 | 3/2001 | Collison et al. |
| 6,204,192 B1 | 3/2001 | Zhao et al. |
| 6,209,484 B1 | 4/2001 | Huang et al. |
| 6,230,652 B1 | 5/2001 | Tanaka et al. |
| 6,245,690 B1 | 6/2001 | Yau et al. |
| 6,277,733 B1 | 8/2001 | Smith |
| 6,281,135 B1 | 8/2001 | Han et al. |
| 6,287,990 B1 | 9/2001 | Cheung et al. |
| 6,303,523 B2 | 10/2001 | Cheung et al. |
| 6,306,564 B1 | 10/2001 | Mullee |
| 6,319,842 B1 | 11/2001 | Khosla et al. |
| 6,324,439 B1 | 11/2001 | Cheung et al. |
| 6,340,435 B1 | 1/2002 | Bjorkman et al. |
| 6,342,446 B1 | 1/2002 | Smith et al. |
| 6,348,725 B2 | 2/2002 | Cheung et al. |
| 6,350,701 B1 | 2/2002 | Yamazaki |
| 6,358,573 B1 | 3/2002 | Raoux et al. |
| 6,361,707 B1 | 3/2002 | Tanaka et al. |
| 6,365,516 B1 | 4/2002 | Frenkel et al. |
| 6,395,092 B1 | 5/2002 | Sugiarto et al. |
| 6,413,583 B1 | 7/2002 | Moghadam et al. |
| 6,426,304 B1 | 7/2002 | Chien et al. |
| 6,448,187 B2 | 9/2002 | Yau et al. |
| 6,465,964 B1 | 10/2002 | Taguchi et al. |
| 6,511,903 B1 | 1/2003 | Yau et al. |
| 6,511,909 B1 | 1/2003 | Yau et al. |
| 6,517,913 B1 | 2/2003 | Cheung et al. |
| 6,537,422 B2 | 3/2003 | Sakuma et al. |
| 6,537,929 B1 | 3/2003 | Cheung et al. |
| 6,541,282 B1 | 4/2003 | Cheung et al. |
| 6,555,472 B2 | 4/2003 | Aminpur |
| 6,562,544 B1 | 5/2003 | Cheung et al. |
| 6,562,690 B1 | 5/2003 | Cheung et al. |
| 6,569,257 B1 | 5/2003 | Nguyen et al. |
| 6,593,247 B1 | 7/2003 | Huang et al. |
| 6,596,655 B1 | 7/2003 | Cheung et al. |
| 6,632,735 B2 | 10/2003 | Yau et al. |
| 6,638,875 B2 | 10/2003 | Han et al. |
| 6,656,832 B1 * | 12/2003 | Pan et al. .................... 438/627 |
| 6,660,656 B2 | 12/2003 | Cheung et al. |
| 6,660,663 B1 | 12/2003 | Cheung et al. |
| 6,663,715 B1 | 12/2003 | Yuda et al. |
| 6,669,858 B2 | 12/2003 | Bjorkman et al. |
| 6,680,164 B2 | 1/2004 | Nguyen et al. |
| 6,680,420 B2 | 1/2004 | Pang et al. |
| 6,689,930 B1 | 2/2004 | Pang et al. |
| 6,693,043 B1 | 2/2004 | Li et al. |
| 6,709,715 B1 | 3/2004 | Lang et al. |
| 6,720,132 B2 | 4/2004 | Tsai et al. |
| 6,730,593 B2 | 5/2004 | Yau et al. |
| 6,734,115 B2 | 5/2004 | Cheung et al. |
| 6,743,737 B2 | 6/2004 | Yau et al. |
| 6,764,940 B1 | 7/2004 | Rozbicki et al. |
| 6,770,556 B2 | 8/2004 | Yau et al. |
| 6,787,452 B2 | 9/2004 | Sudijono et al. |
| 6,797,188 B1 | 9/2004 | Shen et al. |
| 6,800,571 B2 | 10/2004 | Cheung et al. |
| 6,806,207 B2 | 10/2004 | Huang et al. |
| 6,837,967 B1 | 1/2005 | Berman et al. |
| 6,848,455 B1 | 2/2005 | Shrinivasan et al. |
| 6,858,153 B2 | 2/2005 | Bjorkman et al. |
| 6,869,896 B2 | 3/2005 | Cheung et al. |
| 6,900,135 B2 | 5/2005 | Somekh et al. |
| 6,902,682 B2 | 6/2005 | Shang et al. |
| 6,930,061 B2 | 8/2005 | Cheung et al. |
| 7,023,092 B2 | 4/2006 | Yau et al. |
| 7,070,657 B1 | 7/2006 | Cheung et al. |
| 7,074,298 B2 | 7/2006 | Gondhalekar et al. |
| 7,160,821 B2 | 1/2007 | Huang et al. |
| 7,186,648 B1 | 3/2007 | Rozbicki et al. |
| 7,202,176 B1 | 4/2007 | Goto et al. |
| 7,205,249 B2 | 4/2007 | Cheung et al. |
| 7,227,244 B2 | 6/2007 | Bjorkman et al. |
| 7,256,134 B2 | 8/2007 | Kim et al. |
| 7,288,484 B1 | 10/2007 | Goto et al. |
| 7,297,635 B2 | 11/2007 | Toda et al. |
| 7,344,993 B2 | 3/2008 | Balasubramaniam et al. |
| 7,390,755 B1 | 6/2008 | Chen et al. |
| 7,432,209 B2 | 10/2008 | Delgadino et al. |
| 7,465,680 B2 | 12/2008 | Chen et al. |
| 7,468,326 B2 | 12/2008 | Chen et al. |
| 7,556,712 B2 | 7/2009 | Yi et al. |
| 7,560,377 B2 | 7/2009 | Cheung et al. |
| 7,569,492 B1 | 8/2009 | Chen et al. |
| 7,585,777 B1 | 9/2009 | Goto et al. |
| 7,595,005 B2 | 9/2009 | Balasubramaniam |
| 7,597,816 B2 | 10/2009 | Chang et al. |
| 7,601,272 B2 | 10/2009 | Nguyen et al. |
| 7,628,864 B2 | 12/2009 | Moriya et al. |
| 7,651,949 B2 | 1/2010 | Jo |
| 7,740,768 B1 | 6/2010 | Goto et al. |
| 8,058,178 B1 | 11/2011 | Goto et al. |
| 8,058,181 B1 | 11/2011 | Chen et al. |
| 8,097,527 B2 | 1/2012 | Yang |
| 8,129,281 B1 | 3/2012 | Cheung et al. |
| 8,193,096 B2 | 6/2012 | Goto et al. |
| 8,435,895 B2 | 5/2013 | Chen et al. |
| 8,444,869 B1 | 5/2013 | Goto et al. |
| 2001/0014529 A1 | 8/2001 | Chen et al. |
| 2002/0000202 A1 | 1/2002 | Yuda et al. |
| 2002/0005392 A1 | 1/2002 | Luo et al. |
| 2002/0045331 A1 | 4/2002 | Aminpur |
| 2002/0072016 A1 | 6/2002 | Chen et al. |
| 2002/0078976 A1 | 6/2002 | Nguyen |
| 2002/0081854 A1 | 6/2002 | Morrow et al. |
| 2002/0090827 A1 | 7/2002 | Yokoshima |
| 2002/0111041 A1 | 8/2002 | Annapragada et al. |
| 2002/0132486 A1 | 9/2002 | Williams et al. |
| 2002/0139775 A1 | 10/2002 | Chang et al. |
| 2002/0185151 A1 | 12/2002 | Qingyuan et al. |
| 2002/0185226 A1 | 12/2002 | Lea et al. |
| 2002/0187643 A1 | 12/2002 | Gu et al. |
| 2002/0197870 A1 | 12/2002 | Johnson |
| 2003/0045115 A1 | 3/2003 | Fang |
| 2003/0045131 A1 | 3/2003 | Verbeke et al. |
| 2004/0084412 A1 | 5/2004 | Waldfried et al. |
| 2004/0245091 A1 | 12/2004 | Karim et al. |
| 2004/0248414 A1 | 12/2004 | Tsai et al. |
| 2005/0079723 A1 | 4/2005 | Niimi et al. |
| 2005/0106888 A1 | 5/2005 | Chiu et al. |
| 2005/0158667 A1 | 7/2005 | Nguyen et al. |
| 2005/0196967 A1 | 9/2005 | Savas et al. |
| 2006/0046482 A1 | 3/2006 | Verhaverbeke |
| 2006/0102197 A1 | 5/2006 | Chiang et al. |
| 2006/0138399 A1 | 6/2006 | Itano et al. |
| 2006/0154471 A1 | 7/2006 | Minami |
| 2006/0163202 A1 | 7/2006 | Shimizu |
| 2006/0191478 A1 | 8/2006 | Gondhalekar et al. |
| 2006/0201623 A1 | 9/2006 | Yoo |
| 2006/0289384 A1 | 12/2006 | Pavel et al. |
| 2007/0040172 A1 | 2/2007 | Kawakami et al. |
| 2007/0068900 A1 | 3/2007 | Kim et al. |
| 2007/0144673 A1 | 6/2007 | Yeom |
| 2007/0178698 A1 | 8/2007 | Okita et al. |
| 2007/0224826 A1 | 9/2007 | Delgadino et al. |
| 2007/0235137 A1 | 10/2007 | Tsukamoto et al. |
| 2007/0281491 A1 | 12/2007 | Kamp |
| 2008/0026589 A1 | 1/2008 | Hubacek et al. |
| 2008/0102646 A1 | 5/2008 | Kawaguchi et al. |
| 2008/0248656 A1 | 10/2008 | Chen et al. |
| 2008/0286697 A1 | 11/2008 | Verhaverbeke et al. |
| 2009/0053901 A1 | 2/2009 | Goto et al. |
| 2009/0056875 A1 | 3/2009 | Goto et al. |
| 2009/0061623 A1 | 3/2009 | Chang et al. |
| 2009/0200268 A1 | 8/2009 | Tappan et al. |
| 2009/0221148 A1 | 9/2009 | Uda et al. |
| 2009/0277871 A1 | 11/2009 | Berry et al. |
| 2010/0015812 A1 | 1/2010 | Nishikawa |
| 2010/0062591 A1 | 3/2010 | Lin et al. |
| 2010/0216312 A1 | 8/2010 | Yamamoto et al. |

(56) References Cited

U.S. PATENT DOCUMENTS

| | | |
|---|---|---|
| 2011/0139175 A1 | 6/2011 | Cheung et al. |
| 2011/0139176 A1 | 6/2011 | Cheung et al. |
| 2011/0143548 A1 | 6/2011 | Cheung et al. |
| 2012/0211473 A1 | 8/2012 | Goto et al. |
| 2013/0048014 A1 | 2/2013 | Shaviv et al. |

FOREIGN PATENT DOCUMENTS

| | | |
|---|---|---|
| EP | 1081754 | 7/2001 |
| JP | 2003/264170 | 9/2003 |
| JP | 2007/019367 | 1/2007 |
| JP | 2007-266610 | 10/2007 |
| WO | 2011/071980 | 6/2011 |
| WO | 2011/072042 | 6/2011 |
| WO | 2011/072061 | 6/2011 |
| WO | 2012/18375 | 2/2012 |

OTHER PUBLICATIONS

U.S. Office Action for U.S. Appl. No. 10/890,653 mailed Jul. 27, 2005.
U.S. Final Office Action for U.S. Appl. No. 10/890,653 mailed Jan. 10, 2006.
U.S. Office Action for U.S. Appl. No. 10/890,653 mailed Jun. 26, 2006.
U.S. Office Action for U.S. Appl. No. 10/890,653 mailed Oct. 11, 2006.
U.S. Office Action for U.S. Appl. No. 10/890,653 mailed Apr. 5, 2007.
Notice of Allowance for U.S. Appl. No. 10/890,653 mailed Jun. 15, 2007.
Allowed Claims for U.S. Appl. No. 10/890,653.
Supplemental Notice of Allowance for U.S. Appl. No. 10/890,653 mailed Jul. 23, 2007.
Goto et al., "Enhanced Stripping of Low-K Films Using Downstream Gas Mixing," Novellus Systems, Inc., U.S. Appl. No. 11/011,273, filed Dec. 13, 2004.
Notice of Allowance for U.S. Appl. No. 11/011,273 mailed Nov. 28, 2006.
Allowed Claims for U.S. Appl. No. 11/011,273.
Goto et al., "Enhanced Stripping of Low-K Films Using Downstream Gas Mixing," Novellus Systems, Inc., U.S. Appl. No. 11/712,253, filed Feb. 27, 2007, pp. 1-28.
U.S. Office Action for U.S. Appl. No. 11/712,253 mailed Dec. 23, 2008.
Goto, et al., "Photoresist Strip Method for Low-K Dielectrics," U.S. Appl. No. 11/859,727, filed Sep. 21, 2007.
U.S. Office Action for U.S. Appl. No. 11/859,727 mailed Oct. 6, 2008.
Notice of Allowance for U.S. Appl. No. 11/859,727 mailed May 1, 2009.
Allowed Claims for U.S. Appl. No. 11/859,727.
Goto, et al., "High Dose Implantation Strip (HDIS) In H2 Base Chemistry," Novellus Systems, Inc., U.S. Appl. No. 12/251,305, filed Oct. 14, 2008.
Goto, et al., "Photoresist Strip Method for Low-K Dielectrics," U.S. Appl. No. 12/533,461, filed Jul. 31, 2009.
U.S. Office Action for U.S. Appl. No. 11/712,253 mailed Jul. 17, 2009.
Chen, et al., "Method for Post-Etch Cleans," U.S. Appl. No. 10/137,096, May 1, 2002.
U.S. Office Action for U.S. Appl. No. 10/137,096 mailed Jul. 11, 2003.
U.S. Final Office Action for U.S. Appl. No. 10/137,096 mailed Jul. 27, 2007.
Notice of Allowance for U.S. Appl. No. 10/137,096 mailed Jan. 15, 2008.
Allowed Claims for U.S. Appl. No. 10/137,096.
Chen, et al., "Method for Post-Etch Cleans," U.S. Appl. No. 12/111,095, filed Aug. 28, 2008.
U.S. Office Action for U.S. Appl. No. 12/111,095 mailed Aug. 25, 2008.
Notice of Allowance for U.S. Appl. No. 12/111,095 mailed Apr. 3, 2009.
Allowed Claims for U.S. Appl. No. 12/111,095.
Chen, et al., "Method for Post-Etch Cleans," U.S. Appl. No. 12/502,130, filed Jul. 31, 2009.
U.S. Office Action for U.S. Appl. No. 11/712,253 mailed Jan. 29, 2010.
Notice of Allowance for U.S. Appl. No. 11/548,801 mailed Feb. 17, 2010.
Cheung, et al., "Plasma Based Photoresist Removal System for Cleaning Post Ash Residue," U.S. Appl. No. 11/128,930, filed May 12, 2005.
U.S. Office Action for U.S. Appl. No. 11/128,930 mailed Sep. 13, 2006.
U.S. Final Office Action for U.S. Appl. No. 11/128,930 mailed Mar. 8, 2007.
U.S. Office Action for U.S. Appl. No. 11/128,930 mailed Mar. 19, 2007.
U.S. Office Action for U.S. Appl. No. 11/128,930 mailed Jun. 29, 2007.
U.S. Office Action for U.S. Appl. No. 11/128,930 mailed Dec. 10, 2007.
U.S. Final Office Action for U.S. Appl. No. 11/128,930 mailed Jul. 21, 2008.
U.S. Office Action for U.S. Appl. No. 11/128,930 mailed Mar. 20, 2009.
U.S. Office Action for U.S. Appl. No. 11/128,930 mailed Sep. 17, 2009.
U.S. Office Action for U.S. Appl. No. 11/128,930 mailed Feb. 26, 2010.
U.S. Final Office Action for U.S. Appl. No. 11/128,930 mailed Sep. 9, 2010.
S. Wolf and R.N. Tauber, (Silicon Processing for the VLSI Era, vol. 1—Process Technology, Lattice Press, 1986), pp. 539-543.
U.S. Office Action for U.S. Appl. No. 12/533,461 mailed Nov. 5, 2010.
U.S. Office Action for U.S. Appl. No. 12/502,130 mailed Dec. 8, 2010.
Cheung, et al. "Ultra Low Silicon Loss High Dose Implant Strip," U.S. Appl. No. 12/636,582, filed Dec. 11, 2009.
Cheung, et al. "Low Damage Photoresist Strip Method for Low-K Dielectrics," U.S. Appl. No. 12/636,601, filed Dec. 11, 2009.
Cheung, et al. "Enhanced Passivation Process to Protect Silicon Prior to High Dose Implant Strip," U.S. Appl. No. 12/963,503, filed Dec. 8, 2009.
U.S. Office Action for U.S. Appl. No. 11/712,253 mailed Mar. 1, 2011.
U.S. Office Action for U.S. Appl. No. 11/128,930 mailed May 10, 2011.
U.S. Final Office Action for U.S. Appl. No. 12/533,461 mailed May 26, 2011.
International Search Report and Written Opinion for Application No. PCT/US2010/059388 mailed Jun. 27, 2011.
International Search Report and Written Opinion for Application No. PCT/US2010/059547 mailed Jul. 13, 2011.
International Search Report and Written Opinion for Application No. PCT/US2010/059517 mailed Jul. 14, 2011.
Notice of Allowance for U.S. Appl. No. 12/533,461 mailed Aug. 12, 2011.
Allowed Claims as of Aug. 12, 2011 for U.S. Appl. No. 12/533,461.
Notice of Allowance for U.S. Appl. No. 12/502,130 mailed Aug. 12, 2011.
Allowed Claims as of Aug. 12, 2011 for U.S. Appl. No. 12/502,130.
U.S. Office Action for U.S. Appl. No. 12/251,305 mailed Nov. 2, 2011.
U.S. Office Action for U.S. Appl. No. 12/786,230 mailed Nov. 10, 2011.
Notice of Allowance for U.S. Appl. No. 11/128,930 mailed Oct. 28, 2011.
Allowed Claims as of Oct. 28, 2011, for U.S. Appl. No. 11/128,930.

(56) References Cited

OTHER PUBLICATIONS

Chen, et al., "Methods for Stripping Photoresist and/or Cleaning Metal Regions," U.S. Appl. No. 11/696,633, filed Apr. 7, 2007.
Office Action mailed Dec. 15, 2009, for U.S. Appl. No. 11/696,633.
Office Action mailed May 26, 2010, for U.S. Appl. No. 11/696,633.
Final Office Action mailed Sep. 20, 2010, for U.S. Appl. No. 11/696,633.
Office Action mailed Jun. 6, 2011, for U.S. Appl. No. 11/696,633.
Final Office Action mailed Sep. 28, 2011, for U.S. Appl. No. 11/696,633.
U.S. Appl. No. 13/274,638, filed Oct. 17, 2011, entitled "Photoresist Strip Method for Low-K Dielectrics."
U.S. Appl. No. 13/759,958, filed Feb. 5, 2013, entitled "Methods for Stripping Photoresist and/or Cleaning Metal Regions."
U.S. Appl. No. 13/590,083, filed Aug. 20, 2012, entitled "Photoresist Strip Processes for Improved Device Integrity".
US Notice of Allowance, dated Feb. 17, 2012, issued in U.S. Appl. No. 12/251,305.
US Office Action, dated Apr. 26, 2013, issued in U.S. Appl. No. 13/462,660.
US Office Action, dated Sep. 6, 2012 issued in U.S. Appl. No. 12/636,582.
US Final Office Action, dated May 13, 2013, issued in U.S. Appl. No. 12/636,582.
US Office Action, dated Mar. 30, 2012, issued in U.S. Appl. No. 12/636,601.
US Final Office Action, dated Sep. 5, 2012, issued in U.S. Appl. No. 12/636,601.
US Office Action, dated Feb. 12, 2013, issued in U.S. Appl. No. 12/636,601.
US Office Action, dated Jul. 27, 2012, issued in U.S. Appl. No. 12/963,503.
US Final Office Action, dated Jan. 22, 2013, issued in U.S. Appl. No. 12/963,503.
US Final Office Action, dated Apr. 26, 2012, issued in U.S. Appl. No. 12/786,230.
Notice of Allowance dated Jan. 24, 2013, issued in U.S. Appl. No. 12/786,230.
US Office Action dated Feb. 15, 2013, U.S. Appl. No. 13/274,638.
US Office Action, dated Jan. 27, 2012, issued in U.S. Appl. No. 11/696,633.
US Final Office Action, dated May 15, 2012, issued in U.S. Appl. No. 11/696,633.
Notice of Allowance, dated Oct. 29, 2012, issued in U.S. Appl. No. 11/696,633.
Singapore Written Opinion and Search Report, dated Feb. 2, 2012, issued in Application No. 201104086-2.
Singapore Second Written Opinion, dated Aug. 7, 2012, issued in Application No. 201104086-2.
Japanese Office Action mailed Sep. 25, 2012, issued in Application No. 2009-018046.
Partial European Search Report mailed Apr. 17, 2013, issued in Application No. 12181659.9.
Chinese Office Action mailed Jul. 20, 2012, issued in Application No. 200810187894.4.

\* cited by examiner

PLASMA BASED PHOTORESIST REMOVAL SYSTEM FOR CLEANING POST ASH RESIDUE

CROSS-REFERENCE TO RELATED APPLICATIONS

This application is a continuation of and claims priority from U.S. patent application Ser. No. 11/128,930, filed May 12, 2005, titled "PLASMA BASED PHOTORESIST REMOVAL SYSTEM FOR CLEANING POST ASH RESIDUE," all of which is incorporated herein by this reference.

BACKGROUND OF THE INVENTION

1. Field of the Invention

The present invention relates to a cleaning process used in a semiconductor lithographic manufacturing system and, in particular, to a method for cleaning ash reside on low dielectric constant films after photoresist removal.

2. Description of Related Art

Integrated circuits (ICs) are fabricated on semiconductor wafer substrates by a photolithographic process. The lithographic process allows for a mask pattern of the desired circuit or portion thereof to be transferred via radiant energy of selected wavelengths to a photoresist film on a substrate. Those segments of the absorbed aerial image, whose energy exceeds a threshold energy of chemical bonds in the photoactive component of the photoresist material, create a latent image in the resist. The latent image marks the volume of resist material that either is removed during the development process (in the case of positive photoresist) or remains after development (in the case of negative photoresist) to create a three-dimensional pattern in the resist film. In subsequent processing, the resulting resist film pattern is used as an etch mask to remove underlying substrates from the areas of the patterned openings in the resist layer, or to drive dopants into areas of the substrate not protected by the resist layer.

All the photoresist must be removed before the substrates are subsequently processed. Additionally, any etch-related residues must be thoroughly removed before subsequent processing to avoid embedding impurities in the device. Various methods have been disclosed for cleaning resist residue. For example, U.S. Pat. No. 6,848,455 discloses that resist contaminants are removed from a semiconductor wafer by the in-situ generation of oxidizing species, by the simultaneous application of ultra-violet radiation and chemicals containing oxidants such as hydrogen peroxide and dissolved ozone. Ultrasonic or megasonic agitation is also employed to facilitate resist removal.

Wet cleaning processes have often damaged underlying substrate layers. Plasma based chemically reactive cleaning processes have been used for traditional IC structures that employ Si02 as the inter-layer dielectric since they do not result in any damage to the dielectric material. Such processes for stripping photoresist have employed a plasma formed from a mixture of gases with the presence of oxygen in the plasma. The highly reactive oxygen based plasma reacts with and oxidizes the organic photoresist to form volatile components that are carried away from the wafer surface.

It has been found that highly oxidizing conditions are also generally unsuitable for use on low dielectric constant (low-k) materials, i.e., those having a dielectric constant generally below about 2.7 to 3.0. low-k materials have been used as inter-metal and/or inter-layer dielectrics between conductive interconnects employed to reduce the delay in signal propagation due to capacitive effects. The lower the dielectric constant of the dielectric material, the lower the capacitance of the dielectric and the lower the RC delay of the integrated circuit. Typically, low-k dielectrics are silicon-oxide based materials with some amount of incorporated carbon, commonly referred to as carbon doped oxide (CDO). An example of a CDO is CORAL brand carbon-doped oxides, from Novellus Systems, Inc. of San Jose, Calif. It is believed, although not necessarily proven, that the oxygen scavenges or removes carbon from the low-k materials. In many of these materials such as CDOs, the presence of carbon is instrumental in providing a low dielectric constant. Hence, to the extent that the oxygen removes carbon from these materials, it effectively increases the dielectric constant. As processes used to fabricate integrated circuits move toward smaller and smaller dimensions and requires the use of dielectric materials having lower and lower dielectric constants, it has been found that the conventional strip plasma conditions are not suitable.

Plasma processes that employ NF3 in combination with He have been used with some success for cleaning post etch residues. However, if the amount of fluorine is not controlled properly, excessive residue may remain (F ratio too low), or there is excessive loss of dielectric (F ratio too high). Excessive loss of dielectric leads to loss of critical dimension (CD), the smallest dimension of a shape, pattern or feature that can be produced by the lithographic manufacturing system.

Hydrogen plasmas or hydrogen-based plasmas with a weak oxidizing agent are effective at stripping photo-resist and removing residues from low-k dielectric layers without the problems associated with conventional strip plasmas. However, these methods require a high hydrogen flow to achieve an acceptable strip rate. Because high hydrogen flow requires costly abatement and pump systems, it is desirable to have hydrogen flow as low as possible while maintaining an acceptable strip rate. In addition, it is desirable to reduce hydrogen flow due to hydrogen's flammability and the dangers associated with handling and abating it.

Others have reported using hydrogen-based plasmas with inert gases such as hydrogen and helium introduced with hydrogen at the plasma source. Han et al. U.S. Pat. Nos. 6,281,135 and 6,638,875 describe using a mixture of hydrogen, helium and fluorine and Zhao et al. U.S. Pat. Nos. 5,660, 682 and 6,204,192 describe using a mixture of hydrogen and argon. However, helium or argon ions in the plasma have harmful effects. Mixtures of hydrogen and helium result in high plasma damage on low-k materials due to the long life of ionized helium plasma. Ionized argon causes unwanted sputtering of the quartz material in the plasma tube (the portion of some reactors where the plasma is formed). Introduction of argon to hydrogen plasmas has also been shown to reduce strip rate.

U.S. application Ser. No. 11/011,273 owned by the assignee of the instant invention discloses an improved method and an apparatus for stripping photoresist and removing etch-related residues from dielectric materials. After generating a plasma from a hydrogen gas, optionally containing a weak oxidizing agent such as carbon dioxide, an inert gas is introduced to the plasma downstream of the plasma source and upstream of a showerhead that directs gas into the reaction chamber. The inert gas mixes with the plasma, reducing the required hydrogen flow rate and improving the low-k dielectric strip rate and strip rate uniformity.

Despite the improvements of the latter in the ashing or stripping of the low-k photoresist materials, it has been found that some high silicon content residue may still remain after such hydrogen plasma cleaning.

Consequently, a need exists in the art for the development of an alternative or additional stripping and cleaning process that effectively remove post-ashing reside and that does not remove excessive amounts of the low-k dielectric materials or otherwise affect or materially alter the properties of low-k dielectric materials.

SUMMARY OF THE INVENTION

Bearing in mind the problems and deficiencies of the prior art, it is therefore an object of the present invention to provide an improved method of cleaning resist from wafer substrates in a lithographic process.

It is another object of the present invention to provide a method of removing resist residue remaining after stripping of a resist layer from a dielectric layer.

A further object of the invention is to provide a method of removing resist residue without damaging an underlying low-k dielectric layer.

It is yet another object of the present invention to provide a method of removing resist residue without affecting critical dimension features etched into an underlying low-k dielectric layer.

Still other objects and advantages of the invention will in part be obvious and will in part be apparent from the specification.

The above and other objects, which will be apparent to those skilled in art, are achieved in the present invention which is directed to a method of removing resist reside from a workpiece comprising providing a substrate having thereover a residue to be removed, introducing over the substrate and residue an ionizable gas consisting essentially of at least one noble gas, applying energy to the noble gas to create a plasma of the noble gas, and contacting the residue with the noble gas plasma to remove the residue without substantially harming the underlying substrate.

The preferred noble gas comprises helium. The method is particularly useful where the residue is resist residue, comprising silicon, and the substrate is a dielectric film, such as a low-k dielectric film having a dielectric value less than about 3.0.

In another aspect, the present invention is directed to a method of cleaning a low dielectric constant film in a lithographic process comprising providing a dielectric film having thereover a resist composition, the dielectric film having a dielectric constant no greater than about 4.0, and stripping the resist composition to leave a substantially silicon-containing ash residue on the dielectric film. The method then includes contacting the ash residue with plasma comprising an ionized, essentially pure noble gas to remove the resist residue without substantially affecting the underlying dielectric film.

Yet another aspect of the present invention is directed to a method of cleaning a low dielectric constant film in a lithographic process comprising providing a dielectric film having thereover a resist composition, the dielectric film having a dielectric constant no greater than about 4.0 and hydrogen plasma stripping the resist composition to leave on the substrate residue of the resist composition. The method then includes removing the hydrogen and introducing over the substrate and residue an ionizable gas consisting essentially of at least one noble gas, applying energy to the noble gas to create a plasma of the noble gas, and contacting the residue with the noble gas plasma to remove the residue without substantially harming the underlying substrate.

The aforementioned methods of noble gas plasma removal of the residue may take place at a temperature between about 20 and 450° C.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENTS

Figure 2:
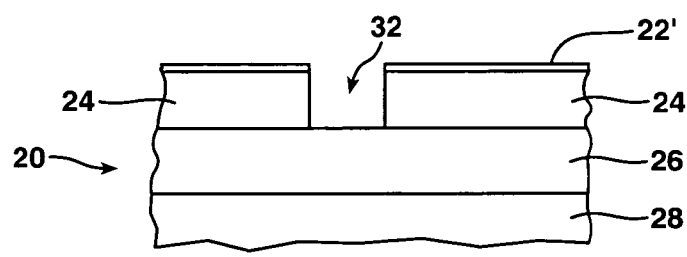
FIG. 2 is a cross-sectional elevational view of the wafer substrate layers of FIG. 1 after the low-k dielectric layer has been etched and the photoresist layer has been stripped, showing the residue layer. The residue may consist of sparsely dispersed patches of string-like material.
Figure 3:
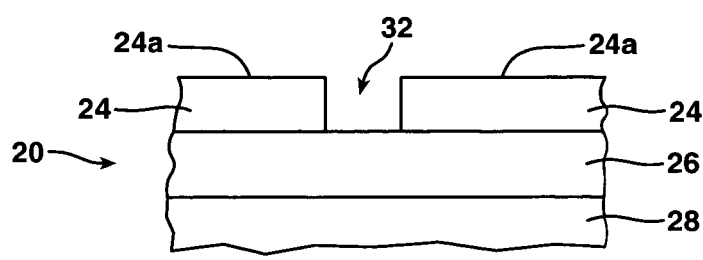
FIG. 3 is a cross-sectional elevational view of the wafer substrate layers of FIG. 2 after the residue layer has been cleaned by the noble plasma process gas method of the present invention, without damage to the low-k dielectric layer.

In describing the preferred embodiment of the present invention, reference will be made herein to FIGS. 1-3 of the drawings in which like numerals refer to like features of the invention.

While the method of the present invention may be used to efficiently and effectively to remove materials from low-k dielectric films, it is not limited to low-k dielectric films, or even to dielectrics. The invention is also not limited to any particular category of low-k dielectrics. For instance, the present invention may be effectively used with dielectrics with k values less than 4.0 (also known as first generation low-k dielectrics), dielectrics with k values less than about 2.8 (second generation low-k dielectrics) and dielectrics with k values less than about 2.0 (ultralow-k dielectrics). The low-k dielectric may be porous or non-porous (the latter sometimes referred to as a dense low-k dielectric). Generally, low-k dense dielectrics are those having k values no greater than 2.8 and low-k porous dielectrics are those having k values no greater than 2.2. Low-k dielectrics of any suitable composition may be used, including silicon oxide based dielectrics doped with fluorine and/or carbon. Non-silicon oxide based dielectrics, such as polymeric materials, may also be used. Any suitable process may be used to deposit the low-k dielectric, including as spin-on deposit and CVD deposit techniques. In the case of forming porous dielectrics, any suitable method may be used. A typical method involves co-depositing a silicon-based backbone and an organic porogen and subsequently removing the porogen component, leaving a porous dielectric film. Other methods include sol-gel techniques. Specific examples of suitable low-k films are carbon based spin-on type films sold under the trademark SiLK by Dow Chemicals, Inc. and CVD deposited porous films sold under the trademark CORAL by Novellus Systems, Inc.

The method of the present invention is most advantageously used to remove resist residue remaining after ashing by the method of U.S. application Ser. No. 11/011,273, the disclosure of which is hereby incorporated by reference.

In general, reactive plasma cleaning is performed in situ in a plasma reactor in which the processing chamber promotes excitation and/or disassociation of the reactant gases by the application of RF energy with capacitively coupled electrodes disposed in the processing chamber. The plasma typically creates a highly reactive species that reacts with and etches away the unwanted deposition material present in the processing chamber.

The plasma reactor apparatus that may be used in practicing the present invention includes a vacuum pump for creating a vacuum in the process chamber. The apparatus of the invention also includes a process gas inlet assembly such as a pressurized gas cylinder coupled to an inlet conduit connected to a gas distribution faceplate or showerhead in the process chamber. The semiconductor wafer substrate or other workpiece rests on a pedestal or platen, which may apply a bias to the substrate. An RF or other power supply applies electrical power between the gas distribution faceplate or showerhead and the pedestal to excite the process gas or mixture of gasses to form a plasma within the cylindrical reaction region between the faceplate and pedestal.

The ionizable process gas used in the present invention is preferably helium, although other ionizable noble gases or mixture of noble gases may be used. Such other gases include neon, argon, krypton, xenon or radon, or mixtures thereof. The noble gas is essentially pure, preferably with a purity of at least about 99.99% by weight, and contains essentially no oxidizers or other reactive agents. During operation, the plasma process gas moves from one side of the vacuum chamber to the other side due to the vacuum generated on the side of the vacuum chamber opposite the side from which the ionizable process gas flows into the chamber. The plasma process gas diffuses across the surface of the wafer substrate removing unwanted resist residue and carrying the material towards the vacuum pump assembly. It may be desirable to keep the wafer temperature within a desired temperature range, such as about 20 to 450° C., and a heating or cooling element may be supplied in the process chamber for such purpose.

Figure 1:
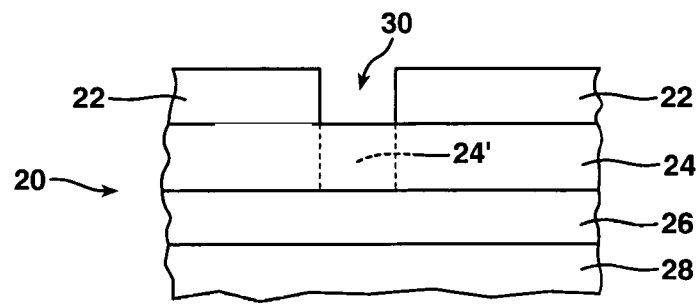
FIG. 1 is a cross-sectional elevational view of layers deposited on a wafer substrate, with a patterned photoresist layer over a low-k dielectric layer to be etched.

As shown in FIG. 1, a wafer 20 comprises substrate layers 26, 28, which may various types of polysilicon, aluminum, copper or other typical films, over which is deposited a low-k dielectric layer 24. A resist layer 22 over the dielectric layer is exposed to a device pattern and developed to remove a volume of resist material 30 corresponding to the pattern. The remaining resist layer 22 is then used as a mask to etch a corresponding volume of material 24' from the dielectric layer 24, for example, by reactive ion etching (RIE). The wafer may then be subject to an ashing process to strip and remove the resist layer, for example by transfer to a plasma reactor and hydrogen plasma stripping of the low-k dielectric film as in the aforementioned U.S. application Ser. No. 11/011,273. FIG. 2 shows the via or trench 32 etched into dielectric layer 24. After stripping, the wafer 20 may still contain post-ash reside comprising a layer of silicon 22' remaining from the resist layer composition. The wafer is then subject to the plasma cleaning method of the present invention using an essentially pure noble process gas. The noble gas plasma processing may be conducted in the same reactor used for the hydrogen plasma ashing process. Subsequently, as shown in FIG. 3, the surface 24a of the resist layer is substantially free of the post-ash silicon residue, and the dimensions of the etched via or trench 32 in the dielectric layer are unaffected.

The following example is intended as further illustration of the invention but is not necessarily limitative except as set forth in the claims. All parts and percentages are by weight unless otherwise indicated.

Example

A batch Gamma 2130™ plasma reactor made by Novellus Systems can be used to ash a low-k dielectric film and clean it using the method of the present invention. The plasma reactor had six stations within the process chamber. A semiconductor wafer having a photoresist film over a dielectric film having a dielectric constant of 2.24 to 2.26 (according to Hg probe measurement of blanket film) was placed on the platen and subjected to the hydrogen plasma cleaning process of U.S. application Ser. No. 11/011,273 in the first five stations to remove the photoresist layer.

After the fifth station, a thin photoresist reside layer substantially comprising silicon remained on the low-k dielectric layer. In the sixth station, essentially pure helium 99.99% purity) was introduced over the low-k dielectric layer in an amount of about 2000 seem. An RF power supply set at 500 W applied high frequency voltage between the electrode and the wafer pedestal, with a bias of about 13.56 mHz applied to the wafer, to ionize the helium gas. The plasma sputtering continued at about 70° C. for about 120 seconds, after which the process was stopped and the wafer with the low-k film was removed from the reactor.

Subsequent scanning electron microscopy revealed that essentially all of the residue was removed from the low-k dielectric film surface, without incurring any substantial damage to the dielectric film properties. Additionally, the critical or other dimensions of the via, trench or other features etched into the dielectric layer are unaffected.

The noble gas flow rate, RF power setting, time of exposure and other parameters may be adjusted to achieve desired results for other cleaning tasks.

Thus, the present invention provides an improved method of cleaning resist from wafer substrates in a lithographic process, particularly when removing resist residue remaining after stripping of a resist layer from a dielectric layer. The present invention eliminates the need for fluorine compounds, such as NF3 or CF4, in the plasma gas, with improved control over the amount of photoresist and residue removal and without damaging the underlying low-k dielectric substrate.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed:

1. A method of removing a resist layer from a substrate comprising:
    subjecting the substrate to an ashing process to remove the resist layer, thereby leaving a post-ash residue to be removed, wherein the ashing process includes exposing the resist layer to a hydrogen plasma;
    applying energy to an ionizable gas consisting essentially of a noble gas to create a plasma consisting essentially of species of the noble gas; and
    contacting the post-ash residue only with the plasma to remove essentially all of the post-ash residue without substantially harming the underlying substrate, wherein essentially all of the post-ash residue is removed by contact with the plasma.

2. The method of claim 1 wherein the substrate includes a dielectric film.

3. The method of claim 1 wherein the resist layer is removed from a dielectric film.

4. The method of claim 1 wherein the substrate includes a dielectric film having a dielectric value less than about 3.0.

5. The method of claim 1 wherein the substrate is subjected to an ashing process and is contacted with the plasma the in the same process chamber.

6. The method of claim 1 wherein the substrate is subjected to an ashing process in one or more stations of a process chamber and is contacted with the plasma in a separate station of the process chamber.

7. The method of claim 1 wherein the post-ash residue comprises silicon.

8. The method of claim 1 wherein the plasma removal of the post-ash residue is at a temperature between about 20° C. and 450° C.

9. The method of claim 1 wherein the plasma is created upstream of the substrate.

10. The method of claim 1 wherein the plasma is created between the substrate and an electrode.

11. A method of cleaning resist residue from a film disposed in a chamber comprising:
  generating, in a plasma source upstream of the chamber, a plasma consisting essentially of one or more ionized, essentially pure noble gases; and
  contacting the resist residue with the plasma to remove the resist residue without substantially affecting the underlying film, wherein the generating and contacting operations are performed after stripping resist from the film using a hydrogen plasma.

12. The method of claim 11 wherein the film is a dielectric film having a dielectric constant no greater than about 2.8.

13. The method of claim 11 wherein the resist residue is removed without contacting the resist residue with a fluorine-containing plasma.

14. The method of claim 11 wherein the plasma removal of the residue is at a temperature between about 20° C. and 450° C.

15. The method of claim 11, wherein the chamber includes multiple stations.

16. The method of claim 11, wherein resist residue is contacted with the plasma in the same chamber as the resist stripping.

17. A method comprising:
  providing a dielectric film having thereover a resist composition, the dielectric film having a dielectric constant no greater than about 4.0;
  hydrogen plasma stripping the resist composition to leave on the dielectric film post-ash residue of the resist composition;
  removing the hydrogen and introducing over the dielectric film and post-ash residue an ionizable gas consisting essentially of one or more noble gases;
  applying energy to the ionizable gas to create a plasma consisting essentially of species of the one or more noble gases; and
  contacting the post-ash residue only with the plasma to remove essentially all of the post-ash residue without substantially harming the underlying dielectric film, wherein essentially all of the post-ash residues are removed by contact with the plasma.

18. The method of claim 17 wherein the dielectric film has a dielectric value less than about 3.0.

19. The method of claim 17 wherein the post-ash resist residue substantially comprises silicon.

20. The method of claim 17 wherein the noble gas plasma removal of the post-ash residue is at a temperature between about 20° C. and 450° C.

* * * * *